(12) United States Patent
Widzgowski et al.

(10) Patent No.: US 11,215,853 B2
(45) Date of Patent: Jan. 4, 2022

(54) ELECTRIC CIRCUIT AND METHOD FOR DRIVING AN ACOUSTO-OPTIC CRYSTAL

(71) Applicant: Leica Microsystems CMS GmbH, Wetzlar (DE)

(72) Inventors: Bernd Widzgowski, Dossenheim (DE); Patric Mrawek, Hassloch (DE)

(73) Assignee: LEICA MICROSYSTEMS CMS GMBH, Wetzlar (DE)

( * ) Notice: Subject to any disclaimer, the term of this patent is extended or adjusted under 35 U.S.C. 154(b) by 572 days.

(21) Appl. No.: 16/053,837

(22) Filed: Aug. 3, 2018

(65) Prior Publication Data

US 2019/0041671 A1 Feb. 7, 2019

(30) Foreign Application Priority Data

Aug. 7, 2017 (DE) ...................... 10 2017 117 851.1

(51) Int. Cl.

| | | |
|---|---|---|
| *G02F 1/11* | (2006.01) | |
| *G08C 19/00* | (2006.01) | |
| *H04R 17/00* | (2006.01) | |
| *H01L 41/04* | (2006.01) | |
| *H01L 41/09* | (2006.01) | |
| *H01L 41/107* | (2006.01) | |
| *H03H 7/46* | (2006.01) | |
| *H04R 3/14* | (2006.01) | |

(52) U.S. Cl.
CPC ............. *G02F 1/113* (2013.01); *G08C 19/00* (2013.01); *H01L 41/042* (2013.01); *H01L 41/09* (2013.01); *H01L 41/107* (2013.01); *H04R 17/00* (2013.01); *H03H 7/46* (2013.01); *H04R 3/14* (2013.01)

(58) Field of Classification Search
None
See application file for complete search history.

(56) References Cited

U.S. PATENT DOCUMENTS

| | | | |
|---|---|---|---|
| 6,848,825 B1 | 2/2005 | Simon et al. | |
| 7,006,274 B1 * | 2/2006 | Wittenberg | ............... G02F 1/33 |
| | | | 348/E9.026 |
| 2002/0000507 A1 | 1/2002 | Engelhardt | |
| 2010/0232011 A1 * | 9/2010 | Seyfried | ............ G02B 21/0036 |
| | | | 359/305 |
| 2017/0143984 A1 * | 5/2017 | Otten | ..................... A61N 5/025 |

FOREIGN PATENT DOCUMENTS

| | | |
|---|---|---|
| DE | 19827140 A1 | 12/1999 |
| DE | 10029167 A1 | 1/2002 |

* cited by examiner

*Primary Examiner* — Robert E. Tallman
(74) *Attorney, Agent, or Firm* — Leydig, Voit & Mayer, Ltd.

(57) ABSTRACT

An electric circuit for driving an acousto-optic crystal includes a piezoelectric converter configured to drive the acousto-optic crystal to vibrate mechanically. A signaling cable is configured to conduct a first electrical alternating-current signal and a second electrical signal. The electric circuit further includes a first frequency-separating filter and a second frequency-separating filter, each of the frequency-separating filters having an input, a high-frequency output and a low-frequency output. The input of the first frequency-separating filter and the input of the second frequency-separating filter is connected to the signaling cable, and the high-frequency output of the second frequency-separating filter is connected to the piezoelectric converter.

17 Claims, 1 Drawing Sheet

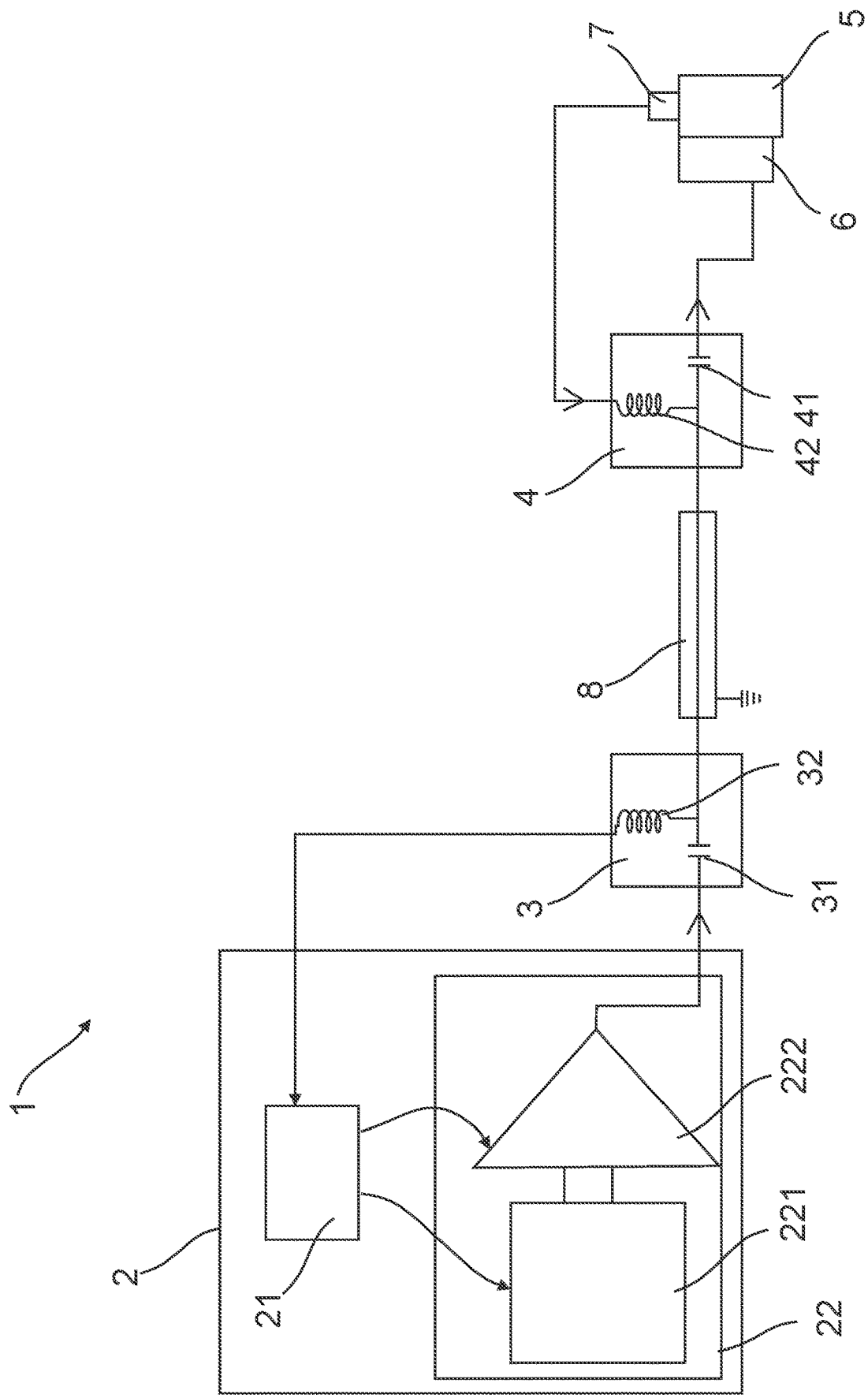

ELECTRIC CIRCUIT AND METHOD FOR DRIVING AN ACOUSTO-OPTIC CRYSTAL

CROSS-REFERENCE TO PRIOR APPLICATION

Priority is claimed to German Patent Application No. DE 10 2017 117 851.1, filed on Aug. 7, 2017, the entire disclosure of which is hereby incorporated by reference herein.

FIELD

The present invention relates to an electric circuit for driving an acousto-optic crystal as well as a method for driving an acousto-optic crystal.

BACKGROUND

An essential requirement in numerous microscopes is providing excitation light with one or more predetermined wavelengths, regardless of the method used. Depending on the type of microscopy method and/or depending on the type of sample, one or more excitation light beams are provided with predetermined spectral properties.

In conventional laser microscopes, the excitation light is provided by one or more excitation laser wherein, however, as a rule, merely a limited wavelength range or a limited selection of spectral lines is made available. This limits the application of the microscopes to specific types of samples, specific microscopy methods and/or specific dyes for tinting the sample.

Microscopes which can exploit coherent white light sources as light source are also known. Similarly to conventional microscopes having non-coherent light sources which generate incoherent light with a broad spectrum from which then the required spectral ranges can be selected by means of wavelength-selective elements, these microscopes also use broadband, coherent light sources.

With the help of wavelength-selective elements, a specific wavelength or a specific spectral range can be selected from the broadband coherent light produced from white light lasers or broadband light sources. Different wavelength-selective elements of this type, such as for example prisms or grids, have been known for a long time.

For several years, however, wavelength-selective elements which are based on the acousto-optic effect have been used increasingly. These types of acousto-optic elements have a so-called acousto-optic crystal which is driven to vibrate by means of an acoustic signal transmitter, also called converter or "transducer". A converter of this type has a piezoelectric material and two or more electrodes contacting this material. By electrically connecting the electrodes with high frequencies which lie typically in the range between 10 MHz and 10 GHz, the piezoelectric material is excited to vibrate, with the result that an acoustic which passes through the crystal wave can be produced. Acousto-optic crystals are characterized by the resulting sound wave changing the optical properties of the crystal.

The high-frequency electrical signals for the converter are conventionally generated in a frequency generator and amplified by means of the high-frequency amplifier such that the amplitude is sufficiently large to drive the crystal to vibrate.

SUMMARY

In an embodiment, the present invention provides an electric circuit for driving an acousto-optic crystal. The electric circuit includes a piezoelectric converter configured to drive the acousto-optic crystal to vibrate mechanically, and a signaling cable configured to conduct a first electrical alternating-current signal and a second electrical signal. The electric circuit further includes a first frequency-separating filter and a second frequency-separating filter, each of the frequency-separating filters having an input, a high-frequency output and a low-frequency output. The input of the first frequency-separating filter and the input of the second frequency-separating filter is connected to the signaling cable, and the high-frequency output of the second frequency-separating filter is connected to the piezoelectric converter.

BRIEF DESCRIPTION OF THE DRAWING

The present invention will be described in even greater detail below based on the exemplary figure. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawing which illustrates the following:

FIG. 1 shows, schematically, a preferred embodiment of an electric circuit according to the invention.

DETAILED DESCRIPTION

The inventors have recognized that the electrical power supplied to the acousto-optic crystals described above is, to a large extent, converted to heat in the crystal, and heats the crystal in this way. By increasing the temperature of the crystal, essential crystal parameters drift and the high-frequency drive are tracked accordingly. For this, measured value feedback, in particular of the temperature, can be provided from the crystal to the drive circuit. As the acousto-optic crystal is a small component and is usually built into a microscope, the cabling additionally required for this should be as simple and space-saving as possible.

The electric circuit according to an embodiment of the invention for driving an acousto-optic crystal comprises a piezoelectric converter for driving the crystal to vibrate mechanically, a signaling cable for conducting a first electrical alternating-current signal and a second electrical signal, and a first and a second frequency-separating filter each with an input, a high-frequency output and a low-frequency output, wherein the input of the first frequency-separating filter and the input of the second frequency-separating filter are connected to the signaling cable and the high-frequency output of the second frequency-separating filter is connected to the piezoelectric converter.

In this way, advantageously two electrical signals, both the first alternating-current signal which is conducted on the piezoelectric converter in order to drive the crystal to vibrate as desired, and also a second electrical signal which is preferably a measurement signal or drive signal which is conducted to the sensors or actuators on the crystal side, in order for example to measure the temperature of the crystal and/or drive the actuators, can be conducted via a single signaling cable. This is particularly space-saving as only one connection assembly to the acousto-optic crystal is necessary. Furthermore, this is advantageous as only one signaling cable is present, and thus this cannot be inserted incorrectly or forgotten.

Preferably, the first frequency-separating filter and the second frequency-separating filter are bidirectional frequency-separating filters, with the result that one or more signals can be coupled in or out via the input, and that signals can be both coupled in and out via the low-frequency output and/or the high-frequency output. In particular these are passive frequency-separating filters.

In an advantageous embodiment, the first and/or second frequency-separating filters each comprise at least one high-pass filter allocated to the high-frequency output and/or at least one low-pass filter allocated to the low-frequency output. This is advantageous, as in this way the high-frequency output is suitable above all for allowing through a high-frequency alternating-current signal, which is matched specifically to the requirements of the acousto-optic crystal, as a high-frequency alternating-current signal, e.g. between 10 MHz and 10 GHz, is necessary to drive the piezoelectric converter, while the low-frequency output is suitable particularly for a low-frequency signal, in particular below 1 MHz, which is very suitable for example for a measurement signal or drive signal. Preferably, an upper cut-off frequency of the low-pass filter is 1 MHz, while a lower cut-off frequency of the high-pass filter is preferably 10 MHz. In this way, the first and second frequency-separating filters advantageously serve also to separate the first alternating-current signal from the second electrical signal.

In a further advantageous embodiment, the high-pass filter comprises at least one capacitor. A capacitor is particularly advantageously suitable for a high-pass filter as its resistance decreases as frequency increases.

In a further advantageous embodiment the low-pass filter comprises at least one inductor. An inductor is particularly advantageously suitable for a low-pass filter as its resistance decreases as frequency decreases.

In a further advantageous embodiment, the electric circuit furthermore comprises a test circuit which is connected to the low-frequency output of the second frequency-separating filter and is equipped to detect at least one physical value of the crystal, in particular a temperature, and output a corresponding measurement signal at the low-frequency output of the second frequency-separating filter. This is advantageous because, as described above, monitoring physical values is helpful for precise driving of the acousto-optic crystal. The optical properties of the crystal depend in particular on the temperature.

In a further advantageous embodiment, the electric circuit furthermore comprises an actuator circuit which is connected to the low-frequency output of the second frequency-separating filter and is equipped to receive a drive signal from the low-frequency output of the second frequency-separating filter, particularly preferably to influence the at least one physical value. This is advantageous as, in this way, physical values to which the optical properties of the crystal react sensitively and which are subjected to vibrations, can be influenced and in particular regulated.

In a further embodiment, the electric circuit further comprises a drift which is connected to the high-frequency output of the first frequency-separating filter and is equipped to generate the first electrical alternating-current signal and output same at the high-frequency output of the first frequency-separating filter. The drift can in particular have a frequency generator, which in particular is adjustable, and an amplifier, which in particular is adjustable. Frequency and/or power or amplitude of the first electrical alternating-current signal can thus be set particularly simply.

Advantageously, the drift is a part of a control system which is connected to the low-frequency output of the first frequency-separating filter and is equipped to receive the measurement signal of the physical value from the test circuit, to process same and, in response thereto, to drive the drift to generate the first electrical alternating-current signal. Thus in particular the optical behavior of the acousto-optic crystal during operation can be set as desired, wherein temperature-contingent changes can be compensated simultaneously by tracking the drive.

In a further advantageous embodiment, the signaling cable is designed as a coaxial cable. This is advantageous, as a coaxial cable conducts high-frequency alternating-current signals particularly faithfully.

Further advantages and embodiments of the invention result from the description and the accompanying drawing.

It is understood that the features mentioned above and those yet to be explained in the following are applicable, not only in the stated combination, but also in other combinations or on their own, without departing from the scope of the present invention.

In FIG. 1 a preferred embodiment of an electric circuit 1 according to the invention is shown schematically. The electric circuit 1 serves to drive an acousto-optic crystal 5.

The electric circuit 1 for driving an acousto-optic crystal 5 comprises a piezoelectric converter 6 for driving the crystal 5 to vibrate mechanically. Furthermore, it comprises a drift 22 which is equipped to generate a first electrical alternating-current signal. Drift 22 comprises a frequency generator 221, which in particular is adjustable, and an amplifier, which in particular is adjustable. Drift 22 is built into a control system 2 which additionally comprises a logic circuit 21, for example a microcontroller. Logic circuit 21 controls the frequency generator 221 and the amplifier 222 in order to set frequency and/or power or amplitude of the first alternating-current signal.

Furthermore, in the shown example, electric circuit 1 comprises a test circuit 7 which is equipped to detect at least one physical value of the crystal. Preferably, the at least one physical value comprises at least one temperature. Test circuit 7 is equipped to output a corresponding measurement signal as second electrical signal. Test circuit 7 can furthermore have an actuator circuit which can influence a physical value of the crystal, in particular likewise the temperature. For this purpose it can have for example a Peltier element.

Within the scope of the invention, it is now provided to transmit the electrical alternating-current signal and the measurement signal jointly via a signaling cable 8 which preferably is designed as a coaxial cable. Two frequency-separating filters 3, 4 are provided for this purpose.

The first frequency-separating filter 3 has an input which is connected to signaling cable 8, a low-frequency output which is connected to control system 2, and a high-frequency output which is likewise connected to control system 2. The second frequency-separating filter 4 has an input which is connected to coaxial cable 8, a low-frequency output which is connected to test circuit 7, and a high-frequency output which is likewise connected to piezoelectric converter 6. In particular these are bidirectional filters, with the result that the names "input" and "output" are not to be understood as exclusive direction details. Equally, signals can enter the filter via an "output" and leave the filter via the "input".

First frequency-separating filter 3 and second frequency-separating filter 4 each comprise a high-pass filter for coupling out or in the first alternating-current signal, which is designed preferably as a high-frequency electrical alternating-current signal between 10 MHz and 10 GHZ. Here, this high-pass filter is shown as a 1st order filter and has a capacitor 31, 41. However, in practice, further inductors and/or capacitors and/or resistors can be provided depending on the slew rate requirement, i.e. these can be higher order filters. In this way, a high-frequency signal is passed through when coupling in or out through the high-frequency output of the first or second frequency-separating filter 3, 4, while the level of a low-frequency signal is clearly reduced.

Furthermore, the first frequency-separating filter 3 and the second frequency-separating filter 4 each comprise a low-pass filter for coupling out or in the second electrical signal which is designed preferably as a low-frequency signal below 1 MHz. Here, this low-pass filter is shown as a 1st order filter and has an inductor 32, 42. However, in practice, further inductors and/or capacitors and/or resistors can also be provided depending on the slew rate requirement, i.e. these can be higher order filters. In this way, first frequency-separating filter 3 and second frequency-separating filter 4 serve advantageously to separate the first alternating-current signal from the second electrical signal, as the inductor for high-frequency signals represents a large resistance while lower frequencies pass through.

Two electrical signals are thus conducted via the one signaling cable 8, both the first alternating-current signal which is conducted onto the piezoelectric converter 6 in order to drive the crystal 5 to vibrate, as desired, and also a second electrical signal which is preferably a measurement signal or drive signal.

The first alternating-current signal is thus generated as a high-frequency signal between 10 MHz and 10 GHz in drift 22, via which capacitor 31 is coupled into the coaxial cable in the first frequency-separating filter 3, via which capacitor 41 is coupled out from coaxial cable 8 in the second frequency-separating filter 4 and used to drive the piezoelectric converter 6 in order to drive the crystal 5 to vibrate.

The electrical power which is supplied to the crystal 5 via piezoelectric converter 6 is, to a large extent, converted into heat in the crystal, and in this way heats the crystal. Essential crystal parameters drift due to the increase in temperature of the crystal, and the high-frequency drive should be tracked accordingly.

The second signal is coupled from test circuit 7 into coaxial cable 8 via inductor 42 in second frequency-separating filter 4 as a measurement signal which carries information, preferably a temperature, about a physical value of the crystal, is coupled out of coaxial cable 8 into first frequency-separating filter 3 via inductor 32, and conducted to logic circuit 21 in control system 2.

This enables control system 2 with logic circuit 21 to set the amplitude and frequency with which the piezoelectric converter 6 is driven, dependent on the measurement signal, thus dependent on the temperature of the crystal 5, with the result that the optical behavior of the crystal 5 is substantially uninfluenced by variations in temperature.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. An electric circuit for driving an acousto-optic crystal, the electric circuit comprising:
    a piezoelectric converter configured to drive the acousto-optic crystal to vibrate mechanically;
    a signaling cable configured to conduct a first electrical alternating-current signal and a second electrical signal; and
    a first frequency-separating filter and a second frequency-separating filter, each of the frequency-separating filters having an input, a high-frequency output and a low-frequency output, the input of the first frequency-separating filter and the input of the second frequency-separating filter being connected to the signaling cable, and the high-frequency output of the second frequency-separating filter being connected to the piezoelectric converter.

2. The electric circuit according to claim 1, wherein the first and/or the second frequency-separating filter has at least one high-pass filter allocated to the high-frequency output and/or at least one low-pass filter allocated to the low-frequency output.

3. The electric circuit according to claim 2, wherein the at least one high-pass filter and/or the at least one low-pass filter each have at least one capacitor and/or inductor.

4. The electric circuit according to claim 1, further comprising a drift which is connected to the high-frequency output of the first frequency-separating filter and is equipped to generate the first electrical alternating-current signal and output the first electrical alternating-current signal at the high-frequency output of the first frequency-separating filter.

5. The electric circuit according to claim 1, further comprising a test circuit which is connected to the low-frequency output of the second frequency-separating filter and is equipped to detect at least one physical value of the crystal and output a corresponding measurement signal at the low-frequency output of the second frequency-separating filter.

6. The electric circuit according to claim 5, wherein the at least one physical value comprises at least one temperature.

7. The electric circuit according to claim 5, further comprising:
    a drift which is connected to the high-frequency output of the first frequency-separating filter and is equipped to generate the first electrical alternating-current signal and output the first electrical alternating-current signal at the high-frequency output of the first frequency-separating filter; and a control system which is connected to the low-frequency output of the first frequency-separating filter and is equipped to receive the measurement signal of the at least one physical value from the test circuit, to process the measurement signal and, in response thereto, to drive the drift to generate the first electrical alternating-current signal.

8. The electric circuit according to claim 1, further comprising an actuator which is connected to the low-frequency output of the second frequency-separating filter and is equipped to receive a drive signal from the low-frequency output of the second frequency-separating filter.

9. The electric circuit according to claim 1, wherein the signaling cable is a coaxial cable.

10. A method for driving an acousto-optic crystal, the method comprising:
  conducting a first electrical alternating-current signal, via a signaling cable, to a piezoelectric converter to drive the acousto-optic crystal to vibrate mechanically at the acousto-optic crystal; and
  conducting a second electrical signal as a measurement signal and/or drive signal, via the same signaling cable.

11. The method according to claim 10, wherein the first electrical alternating-current signal is a high-frequency alternating-current signal between 10 MHz and 10 GHz and the second electrical signal is a low-frequency signal below 1 MHz.

12. The method according to claim 10, wherein:
  the first electrical alternating-current signal is coupled into the signaling cable and/or out of the signaling cable via a high-pass filter, and/or
  the second electrical signal is coupled into the signaling cable and/or out of the signaling cable via a low-pass filter.

13. The method according to claim 10, wherein an electric circuit is used to drive the acousto-optic crystal, the electric circuit comprising:
  the piezoelectric converter;
  the signaling cable; and
  a first frequency-separating filter and a second frequency-separating filter, each of the frequency-separating filters having an input, a high-frequency output and a low-frequency output, the input of the first frequency-separating filter and the input of the second frequency-separating filter being connected to the signaling cable, and the high-frequency output of the second frequency-separating filter being connected to the piezoelectric converter.

14. The method according to claim 10, further comprising coupling the first electrical alternating-current signal out of the signaling cable using a high-pass filter of a frequency-separating filter, and feeding the first electrical alternating-current signal coupled out from the signaling cable to the piezoelectric converter for driving the acousto-optic crystal.

15. The method according to claim 14, further comprising coupling the second electrical signal into or out of the signaling cable using a low-pass filter of the frequency-separating filter.

16. The method according to claim 15, wherein the second electrical signal is conducted as the measurement signal from a test circuit which measures at least one physical value of the acousto-optic crystal, and wherein the second electrical signal into the signaling cable using a low-pass filter of the frequency-separating filter.

17. An electric circuit for driving an acousto-optic crystal, the electric circuit comprising:
  a piezoelectric converter configured to drive the acousto-optic crystal to vibrate mechanically;
  a signaling cable configured to conduct a first electrical alternating-current signal and a second electrical signal; and
  a first frequency-separating filter and a second frequency-separating filter disposed at opposite ends of the signaling cable, each of the frequency-separating filters having a high-pass filter and a low-pass filter configured to couple the first electrical alternating-current signal and the second electrical signal into and/or out of the signaling cable.

* * * * *